US012646580B2

(12) United States Patent
Pi et al.

(10) Patent No.: US 12,646,580 B2
(45) Date of Patent: Jun. 2, 2026

(54) METHODS OF OPERATING MAGNETIC MEMORY DEVICES

(71) Applicant: Samsung Electronics Co., Ltd., Suwon-si (KR)

(72) Inventors: Unghwan Pi, Suwon-si (KR); Stuart Papworth Parkin, Munich (DE); Andrea Migliorini, Munich (DE); Jaechun Jeon, Suwon-si (KR)

(73) Assignees: Samsung Electronics Co., Ltd., Suwon-si (KR); Max-Planck-Gesellschaft zur Förderung der Wissenschaften e.V., Munich (DE)

( * ) Notice: Subject to any disclaimer, the term of this patent is extended or adjusted under 35 U.S.C. 154(b) by 142 days.

(21) Appl. No.: 18/774,226

(22) Filed: Jul. 16, 2024

(65) Prior Publication Data

US 2025/0029670 A1     Jan. 23, 2025

(30) Foreign Application Priority Data

Jul. 18, 2023     (KR) ........................ 10-2023-0093344

(51) Int. Cl.
*G11C 19/08* (2006.01)
*G11C 11/16* (2006.01)
*H10B 61/00* (2023.01)
*H10N 50/10* (2023.01)
*H10N 50/80* (2023.01)

(52) U.S. Cl.
CPC ........ *G11C 19/0841* (2013.01); *G11C 11/161* (2013.01); *G11C 11/1673* (2013.01); *G11C 11/1675* (2013.01); *H10B 61/00* (2023.02); *H10N 50/10* (2023.02); *H10N 50/80* (2023.02)

(58) Field of Classification Search
CPC .............. G11C 19/0841; G11C 11/161; G11C 11/1673; G11C 11/1675; G11C 19/0808; H10B 61/00; H10N 50/10; H10N 50/80
USPC ....................................................... 365/158
See application file for complete search history.

(56) References Cited

U.S. PATENT DOCUMENTS

| | | | |
|---|---|---|---|
| 8,416,611 B2 | 4/2013 | Fukami et al. | |
| 8,477,528 B2 | 7/2013 | Honda et al. | |
| 8,592,930 B2 | 11/2013 | Fukami et al. | |

(Continued)

FOREIGN PATENT DOCUMENTS

KR          102023836 B1     11/2019

*Primary Examiner* — Huan Hoang

(74) *Attorney, Agent, or Firm* — Wolf, Greenfield & Sacks, P.C.

(57) ABSTRACT

A method of operating a magnetic memory device includes: (i) applying a first current to a free layer of a magnetic tunnel junction structure, which includes a magnetic translation unit (MTU) extending between a first magnetic pad and a second magnetic pad, and a tunnel barrier layer and a pinned layer stacked on the MTU, so that a multi-domain is established within the MTU, (ii) applying a magnetic field to the free layer so that the magnetization direction of the MTU switches to become anti-parallel to the magnetization directions of the first magnetic pad and the second magnetic pad, (iii) applying a second current to the free layer so that a portion of the multi-domain penetrates into the first magnetic pad, and (iv) applying another magnetic field to the free layer so that the magnetization direction of the first magnetic pad switches.

20 Claims, 15 Drawing Sheets

(56) References Cited

U.S. PATENT DOCUMENTS

| | | | |
|---|---|---|---|
| 8,649,214 | B2 | 2/2014 | Apalkov et al. |
| 10,062,449 | B2 | 8/2018 | Choe |
| 10,593,414 | B2 | 3/2020 | Vaysset et al. |
| 10,756,255 | B2 | 8/2020 | Song et al. |
| 10,797,229 | B2 | 10/2020 | Buyandalai et al. |
| 10,916,480 | B2 | 2/2021 | Sasaki et al. |
| 2021/0295887 | A1 | 9/2021 | Martin et al. |
| 2021/0359200 | A1* | 11/2021 | Lee ..................... G11C 11/1655 |
| 2022/0123201 | A1 | 4/2022 | Pi et al. |
| 2022/0216266 | A1 | 7/2022 | Pi et al. |
| 2023/0145983 | A1* | 5/2023 | Couet ................... G11C 11/161 |
| | | | 365/158 |

* cited by examiner

FIG. 3

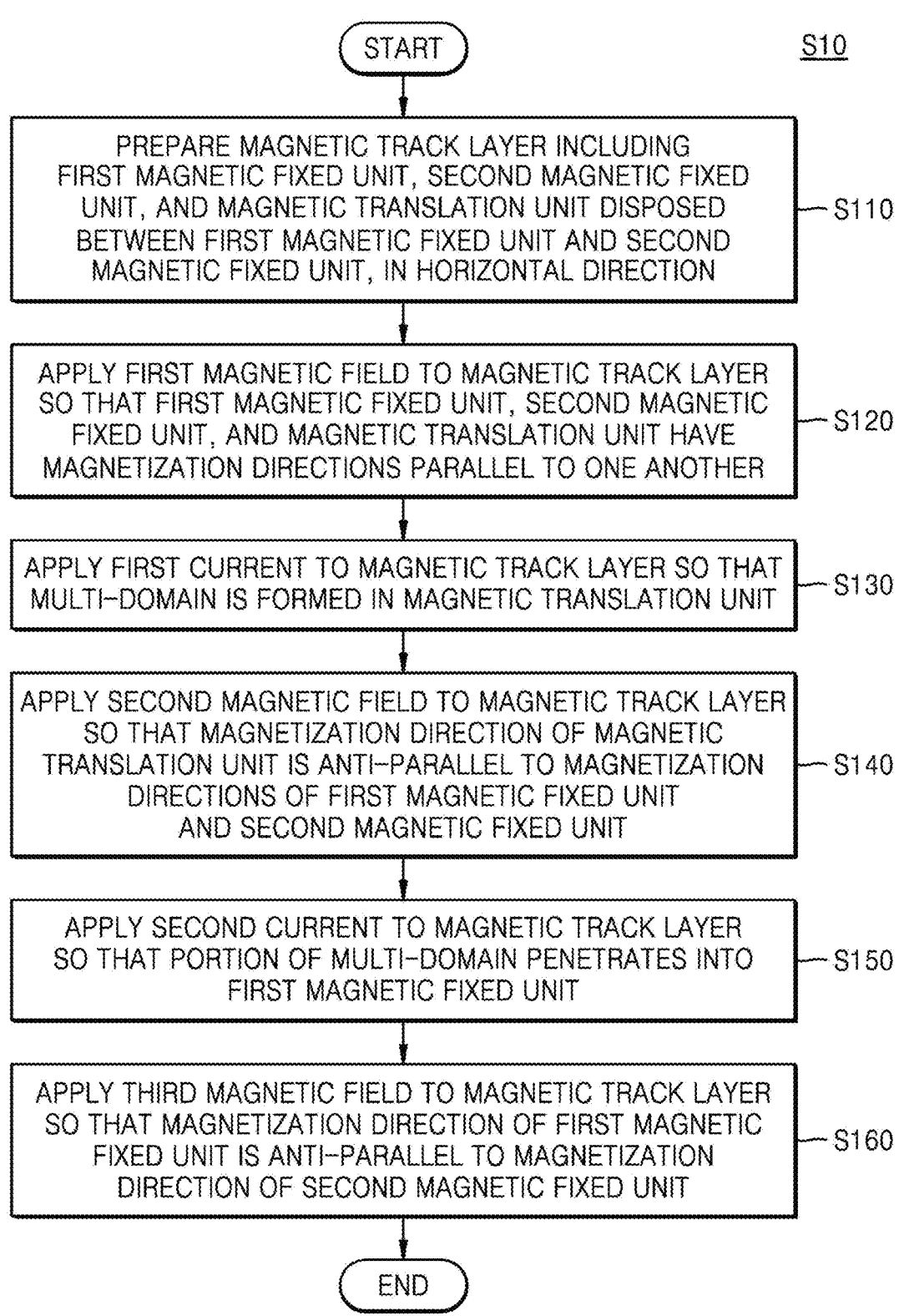

START                                                    S10

PREPARE MAGNETIC TRACK LAYER INCLUDING
FIRST MAGNETIC FIXED UNIT, SECOND MAGNETIC FIXED
UNIT, AND MAGNETIC TRANSLATION UNIT DISPOSED
BETWEEN FIRST MAGNETIC FIXED UNIT AND SECOND
MAGNETIC FIXED UNIT, IN HORIZONTAL DIRECTION        — S110

APPLY FIRST MAGNETIC FIELD TO MAGNETIC TRACK LAYER
SO THAT FIRST MAGNETIC FIXED UNIT, SECOND MAGNETIC
FIXED UNIT, AND MAGNETIC TRANSLATION UNIT HAVE
MAGNETIZATION DIRECTIONS PARALLEL TO ONE ANOTHER   — S120

APPLY FIRST CURRENT TO MAGNETIC TRACK LAYER SO THAT
MULTI-DOMAIN IS FORMED IN MAGNETIC TRANSLATION UNIT  — S130

APPLY SECOND MAGNETIC FIELD TO MAGNETIC TRACK LAYER
SO THAT MAGNETIZATION DIRECTION OF MAGNETIC
TRANSLATION UNIT IS ANTI-PARALLEL TO MAGNETIZATION
DIRECTIONS OF FIRST MAGNETIC FIXED UNIT
AND SECOND MAGNETIC FIXED UNIT                     — S140

APPLY SECOND CURRENT TO MAGNETIC TRACK LAYER
SO THAT PORTION OF MULTI-DOMAIN PENETRATES INTO
FIRST MAGNETIC FIXED UNIT                          — S150

APPLY THIRD MAGNETIC FIELD TO MAGNETIC TRACK LAYER
SO THAT MAGNETIZATION DIRECTION OF FIRST MAGNETIC
FIXED UNIT IS ANTI-PARALLEL TO MAGNETIZATION
DIRECTION OF SECOND MAGNETIC FIXED UNIT            — S160

END

FIG. 5

| | H₁ ⊙<br>H₂ ⊗ | H₁ ⊗<br>H₂ ⊙ |
|---|---|---|
| ← J₁ | ⊗　⊙<br>111　112 | ⊙　⊗<br>111　112 |
| → J₁ | ⊙　⊗<br>111　112 | ⊗　⊙<br>111　112 |

FIG. 6

METHODS OF OPERATING MAGNETIC MEMORY DEVICES

REFERENCE TO PRIORITY APPLICATION

This application claims priority under 35 U.S.C. § 119 to Korean Patent Application No. 10-2023-0093344, filed Jul. 18, 2023, the disclosure of which is hereby incorporated herein by reference.

BACKGROUND

The inventive concept relates to methods of operating memory devices and, more particularly, to methods of operating magnetic memory devices.

High-capacity memory devices are needed for miniaturized, multifunctional, and high-performance electronic products. A racetrack memory (RM), which can include a plurality of magnetic domains that store information according to the movement of a magnetic domain wall between magnetic domains, has been proposed as a high capacity memory device. Also, memory devices of a magnetic domain wall shift register type that include a racetrack have been developed. However, in order to implement magnetic memory devices that support stable movement of a magnetic domain wall and a high degree of integration, various problems have to be solved.

SUMMARY

The inventive concept provides a method of operating a magnetic memory device which may be easily initialized using a more simplified process and efficient operations.

According to an aspect of the inventive concept, there is provided a method of operating a magnetic memory device, which includes preparing a magnetic track layer including a first magnetic fixed unit, a second magnetic fixed unit, and a magnetic translation unit extending between the first magnetic fixed unit and the second magnetic fixed unit, in a horizontal direction. A first magnetic field is applied to the magnetic track layer so that the first magnetic fixed unit, the second magnetic fixed unit, and the magnetic translation unit have magnetization directions that are parallel to one another. A first current is applied to the magnetic track layer so that a multi-domain is formed in the magnetic translation unit. In addition, a second magnetic field is applied to the magnetic track layer so that a magnetization direction of the magnetic translation unit becomes anti-parallel to magnetization directions of the first magnetic fixed unit and the second magnetic fixed unit. A second current is applied to the magnetic track layer so that a portion of the multi-domain penetrates into the first magnetic fixed unit. Next, a third magnetic field is applied to the magnetic track layer so that the magnetization direction of the first magnetic fixed unit becomes anti-parallel to the magnetization direction of the second magnetic fixed unit.

According to another aspect of the inventive concept, there is provided a method of operating a magnetic memory device for fixing a magnetization direction of a first magnetic pad and a magnetization direction of a second magnetic pad to an anti-parallel state with respect to each other. The operating method includes preparing a magnetic tunnel junction structure, which includes a free layer where a magnetic translation unit is disposed between the first magnetic pad and the second magnetic pad in a horizontal direction, and a tunnel barrier layer and a pinned layer each extending on the magnetic translation unit in a vertical direction. A first magnetic field is applied to the free layer so that the first magnetic pad, the second magnetic pad, and the magnetic translation unit have magnetization directions parallel to one another. A first current is applied to the free layer so that a multi-domain is formed in the magnetic translation unit. A second magnetic field is applied to the free layer so that a magnetization direction of the magnetic translation unit becomes anti-parallel to magnetization directions of the first magnetic pad and the second magnetic pad. A second current is applied to the free layer so that a portion of the multi-domain penetrates into the first magnetic pad. A third magnetic field is applied to the free layer so that the magnetization direction of the first magnetic pad becomes anti-parallel to the magnetization direction of the second magnetic pad.

In another method of operating a magnetic memory device according to an embodiment, a magnetic tunnel junction structure is provided, which includes a stack structure of a free layer, a tunnel barrier layer, and a pinned layer. The free layer includes a first magnetic pad, a second magnetic pad, and a magnetic translation unit extending between the first magnetic pad and the second magnetic pad, in a horizontal direction. A magnetic field pulse is applied to the free layer three times and a current pulse is applied to the free layer twice, so as to fix a magnetization direction of the first magnetic pad and a magnetization direction of the second magnetic pad to an anti-parallel state with respect to each other.

A method of operating a magnetic memory device according to another embodiment includes applying a first current to a free layer of a magnetic tunnel junction structure, which includes a magnetic translation unit (MTU) extending between a first magnetic pad and a second magnetic pad, and a tunnel barrier layer and a pinned layer stacked on the MTU, so that a multi-domain is established within the MTU. A magnetic field is applied to the free layer so that the magnetization direction of the MTU switches to become anti-parallel to the magnetization directions of the first magnetic pad and the second magnetic pad. A second current is applied to the free layer so that a portion of the multi-domain penetrates into the first magnetic pad. Then, another magnetic field is applied to the free layer so that the magnetization direction of the first magnetic pad switches to become anti-parallel to the magnetization direction of the second magnetic pad. In these embodiments, the free layer may be a magnetic track layer, and the first magnetic pad, the magnetic translation unit, and the second magnetic pad may be configured to have a bow tie shape when viewed from a plan layout perspective. And, according to some further embodiments, the operating method may include fixing a magnetization direction of the first magnetic pad and a magnetization direction of the second magnetic pad to an anti-parallel state with respect to each other, followed by reading a magnetization direction of the MTU using the magnetic tunnel junction structure.

BRIEF DESCRIPTION OF THE DRAWINGS

Embodiments will be more clearly understood from the following detailed description taken in conjunction with the accompanying drawings in which:

FIG. 3 is a flowchart illustrating an operating method of a magnetic memory device, according to an embodiment;

FIGS. 5 and 6 are tables representing a magnetization direction based on a magnetic field and a current field;

DETAILED DESCRIPTION OF THE EMBODIMENTS

Hereinafter, embodiments will be described in detail with reference to the accompanying drawings.

Figure 1:
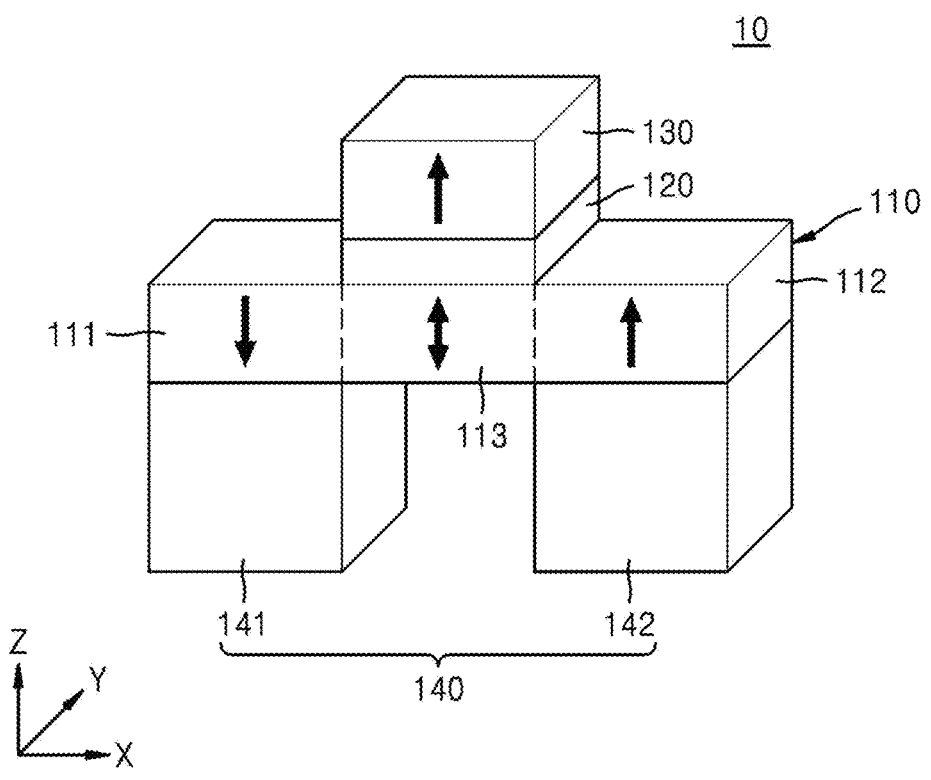
FIG. 1 is a perspective view illustrating main elements of a magnetic memory device according to an embodiment.

FIG. 1 is a perspective view illustrating main elements of a magnetic memory device 10 according to an embodiment. Referring to FIG. 1, the magnetic memory device 10 may include a magnetic track layer 110, a tunnel barrier layer 120, a pinned layer 130, and a conductive layer 140. The magnetic track layer 110 may have a straight-line shape with a long axis extending in a first horizontal direction X parallel to an upper surface of the magnetic track layer 110 and a short axis extending in a second horizontal direction Y perpendicular to the first horizontal direction X. In some embodiments, the magnetic track layer 110 may have a line-shaped track extending in the first horizontal direction X. Herein, the magnetic track layer 110 may be referred to as a free layer.

The magnetic track layer 110 may include at least one metal material of cobalt (Co), iron (Fe), and nickel (Ni). Furthermore, the magnetic track layer 110 may further include at least one of nonmagnetic materials such as boron (B), zinc (Zn), aluminum (Al), titanium (Ti), ruthenium (Ru), tantalum (Ta), silicon (Si), silver (Ag), gold (Au), copper (Cu), carbon (C), and nitrogen (N). The magnetic track layer 110 may include a plurality of magnetic domains and a plurality of magnetic domain walls. The plurality of magnetic domains and the plurality of magnetic domain walls may be arranged alternately and repeatedly in the first horizontal direction X.

The magnetic domain may be a region where a magnetization direction is uniform in the magnetic track layer 110, and the magnetic domain wall may be a region where a magnetization direction is changed between the magnetic domains of the magnetic track layer 110. Each of the magnetic domain walls may define a boundary between magnetic domains having different magnetization directions among the magnetic domains. A size and a magnetization direction of the magnetic domain may be appropriately controlled by a shape, a size, and external energy of the magnetic track layer 110. The magnetic domain wall may be moved by a magnetic field or a current applied to the magnetic track layer 110.

In the magnetic memory device 10 according to an embodiment, the magnetic track layer 110 may include a first magnetic fixed unit 111, a second magnetic fixed unit 112, and a magnetic translation unit 113 disposed between the first magnetic fixed unit 111 and the second magnetic fixed unit 112. Herein, the first magnetic fixed unit 111 may be referred to as a first magnetic domain or a first magnetic pad. Also, the second magnetic fixed unit 112 may be referred to as a second magnetic domain or a second magnetic pad. That is, although not shown, the magnetic domain wall may be disposed between the first magnetic fixed unit 111 and the magnetic translation unit 113 and between the second magnetic fixed unit 112 and the magnetic translation unit 113, respectively.

The tunnel barrier layer 120 may be disposed on an upper surface of the magnetic track layer 110. In some embodiments, the tunnel barrier layer 120 may be disposed on the magnetic translation unit 113. For example, the tunnel barrier layer 120 may include at least one of magnesium (Mg) oxide, Ti oxide, Al oxide, Mg—Zn oxide, and Mg—B oxide. Next, the pinned layer 130 may be disposed on the upper surface of the tunnel barrier layer 120. In some embodiments, the pinned layer 130 may be disposed on the magnetic translation unit 113. In other words, the pinned layer 130 may overlap the magnetic translation unit 113 in a vertical direction Z, with the tunnel barrier layer 120 extending therebetween.

The pinned layer 130 may include a ferromagnetic material. Furthermore, the pinned layer 130 may further include an anti-ferromagnetic material for fixing a magnetization direction of the ferromagnetic material. For example, the pinned layer 130 may include at least one metal material of Co, Fe, and Ni, and may further include at least one of nonmagnetic materials such as B, Zn, Al, Ti, Ru, Ta, Si, Ag, Au, Cu, C, and N. Here, the pinned layer 130 is illustrated as a single-layer structure, but this may be merely an embodiment and embodiments are not limited thereto. In some embodiments, the pinned layer 130 may be provided as a synthetic anti-ferromagnetic (SAF) structure. Also, in the drawings, each of the pinned layer 130 and the tunnel barrier layer 120 is illustrated in a cuboid shape, but embodiments are not limited thereto. For example, each of the pinned layer 130 and the tunnel barrier layer 120 may have a circular pillar shape.

The conductive layer 140 may be disposed on a lower surface of the magnetic track layer 110. In some embodiments, a first conductive layer 141 may be disposed under the first magnetic fixed unit 111, and a second conductive layer 142 may be disposed under the second magnetic fixed unit 112. Furthermore, the conductive layer 140 may include an induction layer which allows a spin orbit torque (SOT) to be generated with a current flowing in the conductive layer 140. In other embodiments, the conductive layer 140 may include a material which allows a spin hall effect or Rashba effect to be implemented with a current which flows in the first horizontal direction X or a direction opposite to the first horizontal direction X in the conductive layer 140. In other words, the conductive layer 140 may be configured as a spin hall conductive layer. Also, the conductive layer 140 may include a heavy metal where an atomic number is 30 or more. For example, the conductive layer 140 may include iridium (Ir), Ru, Ta, platinum (Pt), palladium (Pd), bismuth (Bi), Ti, or tungsten (W), but is not limited thereto.

In the magnetic memory device 10 according to an embodiment, the magnetic track layer 110, the tunnel barrier layer 120, and the pinned layer 130 may configure a magnetic tunnel junction (MTJ) structure. Here, the magnetic track layer 110 may be referred to as a free layer. As will be understood by those skilled in the art, a magnetization direction of the pinned layer 130 may be fixed, and a magnetization direction of the magnetic track layer 110 may be an anti-parallel direction with respect to the magnetization direction of the pinned layer 130, based on stored data.

In some embodiments, when the magnetic track layer 110 and the pinned layer 130 of the MTJ structure are in a parallel state, namely, when the MTJ structure has a low resistance, this parallel state may be defined as a data 0 (zero) state. On the other hand, when the magnetic track layer 110 and the pinned layer 130 of the MTJ structure are in an anti-parallel state, namely, when the MTJ structure has a high resistance, the anti-parallel state may be defined as a data 1 (one) state. However, these designations may be swapped. Thus, in other embodiments, when the magnetic track layer 110 and the pinned layer 130 of the MTJ structure are in an anti-parallel state, this may be defined as a data 0 state, and when the magnetic track layer 110 and the pinned layer 130 of the MTJ structure are in a parallel state, this may be defined as a data 1 state.

In detail, the pinned layer 130 may overlap the magnetic translation unit 113 of the magnetic track layer 110 in the vertical direction Z. Therefore, in the magnetic memory device 10 according to an embodiment, the MTJ structure may read data, based on the magnetization direction of the magnetic translation unit 113.

Here, in the magnetic memory device 10 which is not initialized, a magnetization direction of each of magnetic domains configuring the magnetic track layer 110 may be randomly formed, and thus, may be parallel or anti-parallel to a magnetization direction of the pinned layer 130. That is, a magnetization direction of each of the first magnetic fixed unit 111 and the second magnetic fixed unit 112 each configuring the magnetic track layer 110 may be randomly formed. Thus, the original magnetization direction of each of the first magnetic fixed unit 111 and the second magnetic fixed unit 112 may be parallel or anti-parallel to the magnetization direction of the pinned layer 130.

Therefore, an initialization process of fixing the first magnetic fixed unit 111 and the second magnetic fixed unit 112 each having a random state to a desired magnetization direction may be needed. That is, in the initialization process, the magnetization direction of the first magnetic fixed unit 111 and the magnetization direction of the second magnetic fixed unit 112 may be fixed to an anti-parallel state with respect to each other. Therefore, the magnetic translation unit 113 may be changed between stabilized magnetic states (i.e., fixed states), and thus, an operation of a stable magnetic junction structure for a read and write process may be performed. Such an initialization operation method will be described below in detail.

Figure 2:
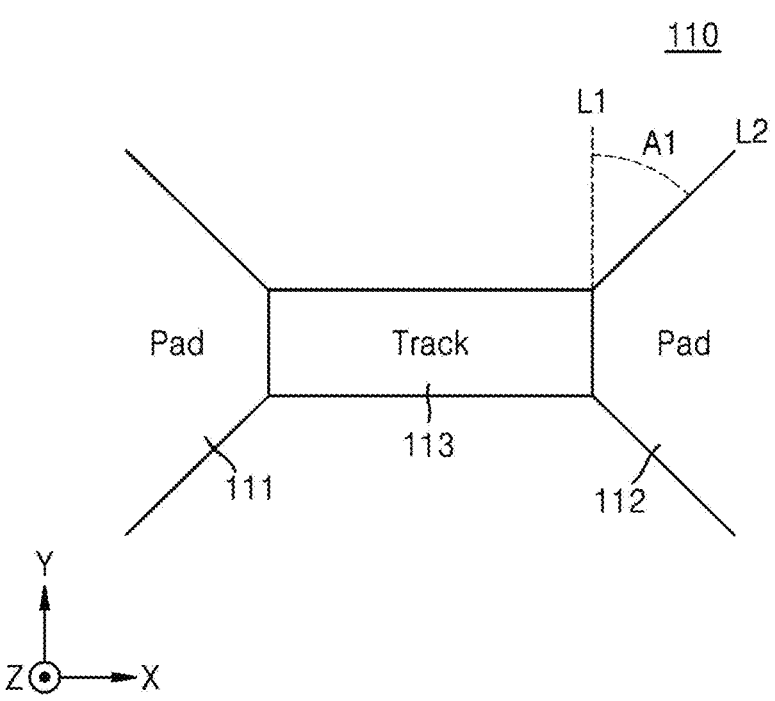
FIG. 2 is a plan view schematically illustrating a free layer in the magnetic memory device of FIG. 1.

FIG. 2 is a plan view schematically illustrating a free layer in the magnetic memory device 10 of FIG. 1. Referring to FIG. 2, a magnetic track layer 110 may include a first magnetic fixed unit 111, a second magnetic fixed unit 112, and a magnetic translation unit 113 disposed between the first magnetic fixed unit 111 and the second magnetic fixed unit 112. The magnetic track layer 110 may be disposed so that the first magnetic fixed unit 111 contacts one side surface of the magnetic translation unit 113 and the second magnetic fixed unit 112 contacts the other side surface of the magnetic translation unit 113. As shown, the magnetic track layer 110 may be treated as a free layer where the first magnetic fixed unit 111, the magnetic translation unit 113, and the second magnetic fixed unit 112 have a bow tie shape in parallel with a first horizontal direction X.

For example, the magnetic translation unit 113 may have a straight-line shape which extends long in the first horizontal direction X and has a certain width in a second horizontal direction Y perpendicular to the first horizontal direction X. Also, the first magnetic fixed unit 111 and the second magnetic fixed unit 112 may be disposed at both end portions of the magnetic translation unit 113 and may have a trapezoid shape where the first magnetic fixed unit 111 and the second magnetic fixed unit 112 are mirror-image symmetrical with each other.

An angle A1 between a virtual line L1 extending along a sidewall of an end portion of the magnetic translation unit 113 and an oblique side L2, having a trapezoid shape, of the second magnetic fixed unit 112 may be configured to be greater than 0 degrees and less than 90 degrees. For example, the angle A1 may be set to 45 degrees. Based on a shape of the magnetic track layer 110, a multi-domain of the magnetic translation unit 113 may easily move to the first magnetic fixed unit 111 and the second magnetic fixed unit 112. In other words, an area of each of the first magnetic fixed unit 111 and the second magnetic fixed unit 112 may enlarge from a boundary surface between the first magnetic fixed unit 111 and the magnetic translation unit 113, and thus, a resistance may decrease, whereby the multi-domain may more easily move in the boundary surface.

FIG. 3 is a flowchart illustrating an operating method S10 of a magnetic memory device, according to an embodiment. Referring to FIG. 3, the operating method S10 of the magnetic memory device may include a process sequence of first to sixth operations S110 to S160. In a case where some embodiments may be differently implemented, a certain operation sequence may be performed unlike a described sequence. For example, two operations which are continuously described may be substantially simultaneously performed, or may be performed in a sequence opposite to a described sequence.

The operating method S10 of the magnetic memory device according to an embodiment may include a first operation S110 of preparing a magnetic track layer including a first magnetic fixed unit, a second magnetic fixed unit, and a magnetic translation unit disposed between the first magnetic fixed unit and the second magnetic fixed unit, in a horizontal direction, a second operation S120 of applying a first magnetic field to the magnetic track layer so that the first magnetic fixed unit, the second magnetic fixed unit, and the magnetic translation unit have magnetization directions parallel to one another, a third operation S130 of applying a first current to the magnetic track layer so that a multi-domain is formed in the magnetic translation unit, a fourth operation S140 of applying a second magnetic field to the magnetic track layer so that the magnetization direction of the magnetic translation unit is anti-parallel to the magnetization directions of the first magnetic fixed unit and the second magnetic fixed unit, a fifth operation S150 of applying a second current to the magnetic track layer so that a portion of the multi-domain penetrates into the first magnetic fixed unit, and a sixth operation S160 of applying a third magnetic field to the magnetic track layer so that the magnetization direction of the first magnetic fixed unit is anti-parallel to the magnetization direction of the second magnetic fixed unit.

To provide a brief description, the operating method S10 of the magnetic memory device may include an operation of alternately applying a magnetic field pulse to the magnetic track layer three times and applying a current pulse to the magnetic track layer twice, so as to fix the magnetization direction of the first magnetic fixed unit and the magnetization direction of the second magnetic fixed unit to an anti-parallel state with respect to each other. However, the operating method S10 of the magnetic memory device is not limited thereto. In other embodiments, the operating method S10 of the magnetic memory device may be easily understood by those of ordinary skill in the art, based on the above description.

Figure 4A:
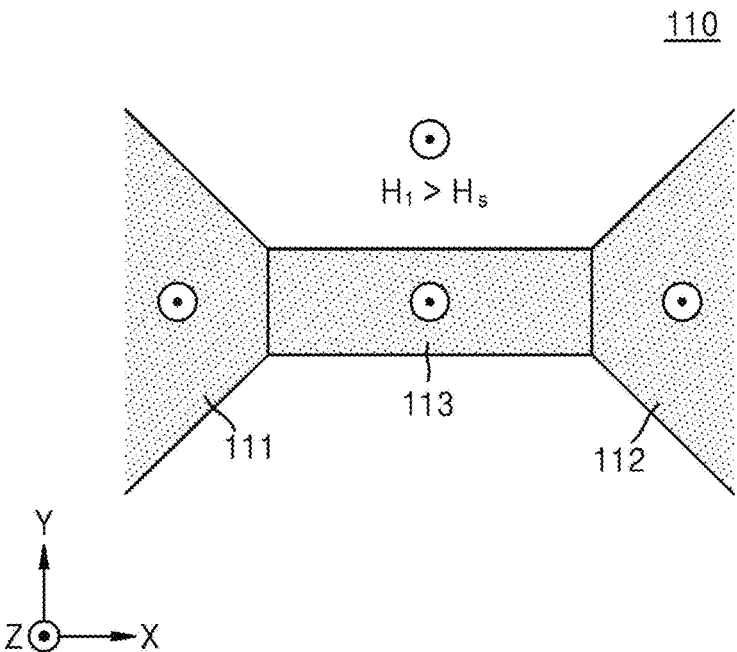
FIGS. 4A to 4E are plan views illustrating, in order, an operating method of a magnetic memory device, according to an embodiment.

A technical feature of each of the first to sixth operations S110 to S160 will be described below in detail with reference to FIGS. 4A to 4E, which are plan views illustrating an operating method of a magnetic memory device in sequence, according to an embodiment. Referring to FIG. 4A, a first magnetic field $H_1$ may be applied to all of a magnetic track layer 110.

As described above, the magnetic track layer 110 may include a first magnetic fixed unit 111, a second magnetic fixed unit 112, and a magnetic translation unit 113 disposed between the first magnetic fixed unit 111 and the second magnetic fixed unit 112, in a first horizontal direction X. In some embodiments, the first magnetic field $H_1$ may be a magnetic field which is programmed so that all of the first magnetic fixed unit 111, the second magnetic fixed unit 112, and the magnetic translation unit 113 have a vertical magnetization direction (for example, +Z). That is, in the first magnetic field $H_1$, a vertical-direction field which is greater than or equal to a threshold magnetic field may be applied to the magnetic track layer 110, and thus, all magnetization directions of magnetic domains may be equal to one another.

Figure 4B:
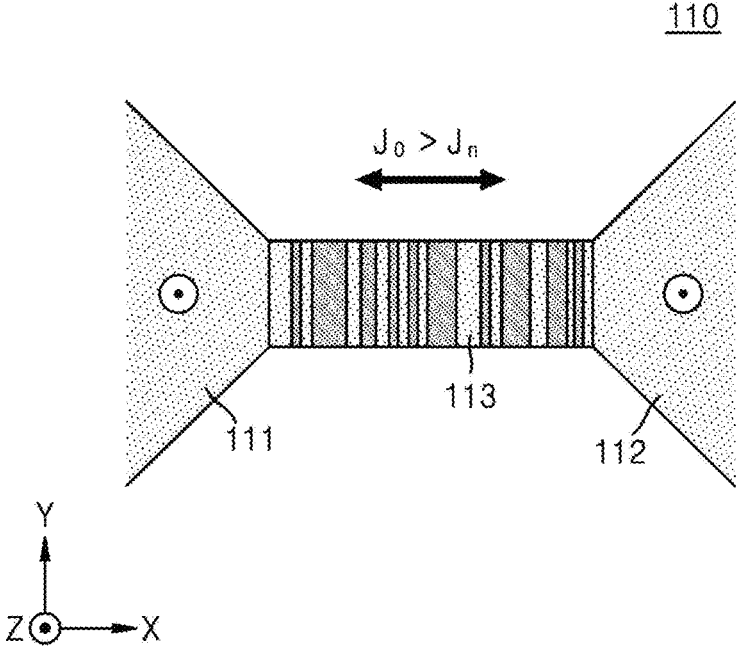

Referring to FIG. 4B, a first current $J_0$ may be applied to all of a magnetic track layer 110. In some embodiments, a magnitude of the first current $J_0$ may be greater than a threshold current $J_n$ of nucleation for forming a multi-domain of a magnetic translation unit 113. Based on the first current $J_0$, the multi-domain may be formed in the magnetic translation unit 113, but a multi-domain may not be formed in the first magnetic fixed unit 111 and the second magnetic fixed unit 112. This may be because a current density is lowered in the first magnetic fixed unit 111 and the second magnetic fixed unit 112 because a line width of the first magnetic fixed unit 111 and a line width of the second magnetic fixed unit 112 are greater than a line width of the magnetic translation unit 113, and thus, does not reach the threshold current $J_n$ of nucleation in the first magnetic fixed unit 111 and the second magnetic fixed unit 112.

Figure 4C:
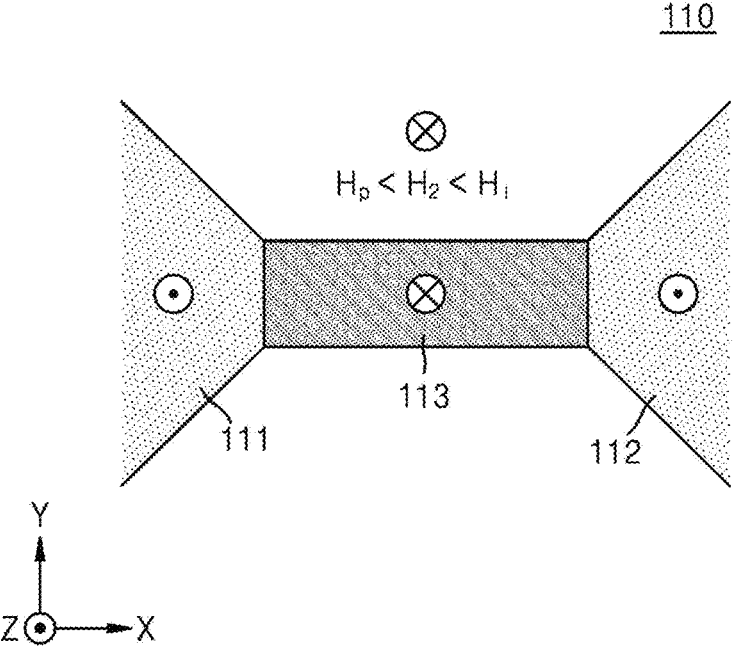

Referring to FIG. 4C, a second magnetic field $H_2$ may be applied to all of a magnetic track layer 110. In some embodiments, a magnitude of the second magnetic field $H_2$ may be set to have a value which is greater than a magnetic field $H_p$ for enabling the multi-domain to move in a magnetic domain and is less than a magnetic field $H_i$ for enabling the multi-domain to enter another magnetic domain. In particular, a magnitude of the second magnetic field $H_2$ may be set to have a value which is greater than a magnetic field $H_p$ for enabling the multi-domain to move in the magnetic translation unit 113, but also less than a magnetic field $H_i$ for enabling the multi-domain to enter the first magnetic fixed unit 111 and the second magnetic fixed unit 112. Therefore, a magnetization direction −Z of the magnetic translation unit 113 of the magnetic track layer 110 may be changed to an anti-parallel state with respect to a magnetization direction +Z of the first magnetic fixed unit 111 and a magnetization direction +Z of the second magnetic fixed unit 112.

Figure 4D:
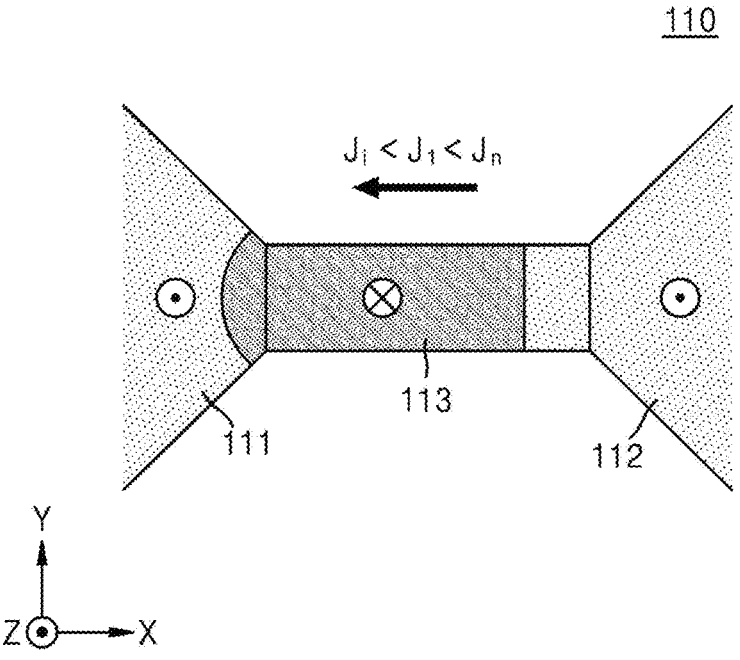

Referring to FIG. 4D, a second current $J_1$ may be applied to all of a magnetic track layer 110. In some embodiments, a magnitude of the second current $J_1$ may be set to be less than a threshold current $J_n$ of nucleation for forming the multi-domain and greater than a movement current $J_i$ for enabling the multi-domain to move in the magnetic track layer 110. Also, a direction of the second current $J_1$ may be set to flow in an opposite direction −X of the first horizontal direction X. Therefore, a portion of the multi-domain of the magnetic translation unit 113 of the magnetic track layer 110 may penetrate into the first magnetic fixed unit 111 through a boundary surface between the first magnetic fixed unit 111 and the magnetic translation unit 113. On the other hand, based on a direction of the second current $J_1$, the multi-domain of the magnetic translation unit 113 may not penetrate into the second magnetic fixed unit 112.

Figure 4E:
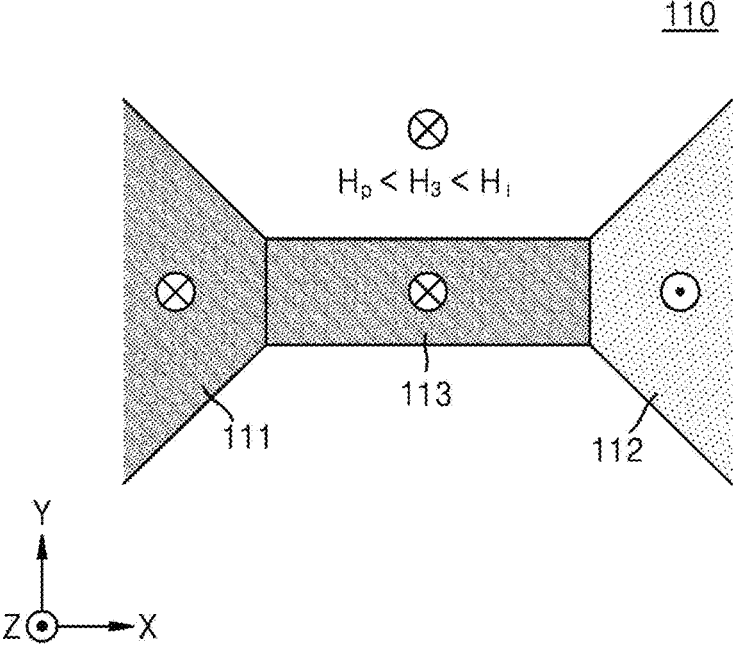

Referring to FIG. 4E, a third magnetic field $H_3$ may be applied to all of a magnetic track layer 110. In some embodiments, a magnitude of the third magnetic field $H_3$ may be set to have a value which is greater than a magnetic field $H_p$ for enabling the multi-domain to move in a magnetic domain and is less than a magnetic field $H_i$ for enabling the multi-domain to enter another magnetic domain. That is, a magnitude of the third magnetic field $H_3$ may be substantially equal to that of the second magnetic field $H_2$. Also, a magnitude of the third magnetic field $H_3$ may be set to have a value which is greater than a magnetic field $H_p$ for enabling the multi-domain to move in the first magnetic fixed unit 111 and is less than a magnetic field $H_i$ for enabling the multi-domain to enter the second magnetic fixed unit 112. Accordingly, a magnetization direction −Z of the first magnetic fixed unit 111 of the magnetic track layer 110 may be changed to a state which is parallel to a magnetization direction −Z of the magnetic translation unit 113 and is anti-parallel to a magnetization direction +Z of the second magnetic fixed unit 112.

Thus, based on the initialization process of the operating method of the magnetic memory device according to an embodiment, the magnetization direction −Z of the first magnetic fixed unit 111 and the magnetization direction +Z of the second magnetic fixed unit 112 may be fixed to an anti-parallel state with respect to each other. Therefore, the magnetic translation unit 113 may be changed between stabilized magnetic states (i.e., fixed states), and thus, an operation of a stable magnetic junction structure for a read and write process may be performed.

Figure 5:
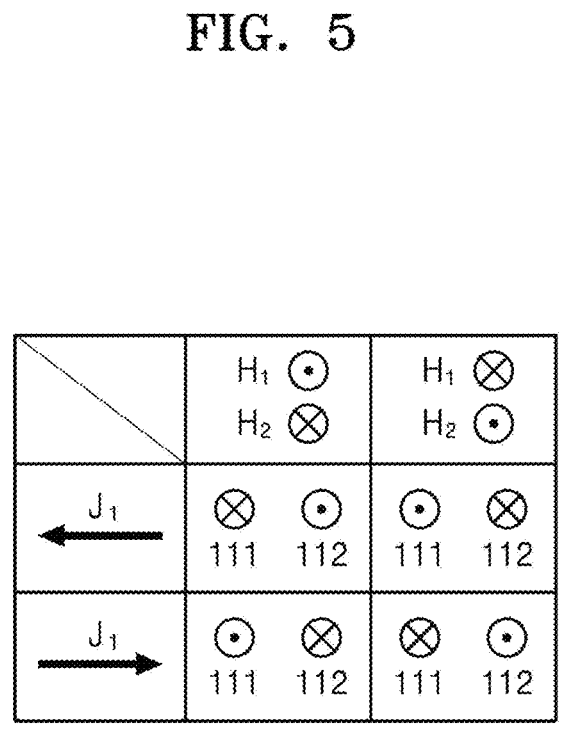
Figure 6:
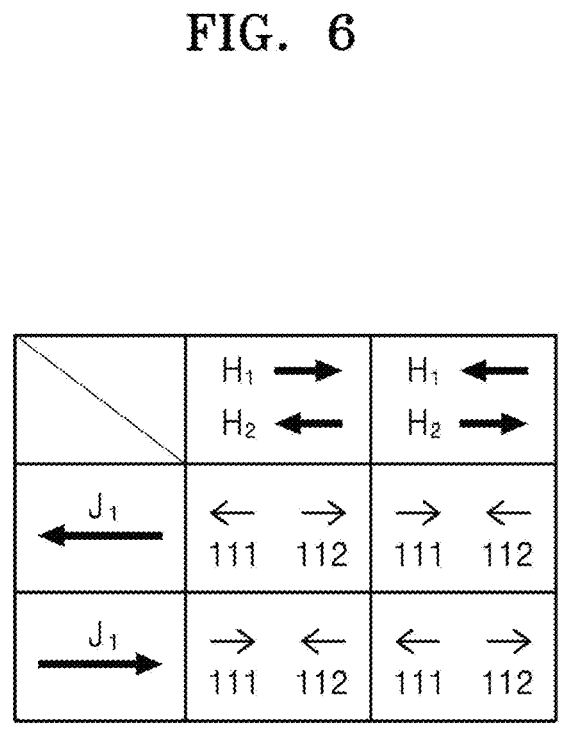

FIGS. 5 and 6 are tables representing a magnetization direction based on a magnetic field and a current field. Referring to FIG. 5, magnetization directions of a first magnetic fixed unit 111 and a second magnetic fixed unit 112 are shown with respect to a direction of a first magnetic field $H_1$, a direction of a second magnetic field $H_2$, and a direction of a second current $J_1$.

In a first scenario in FIG. 5, in a case which the first magnetic field $H_1$ changes all of a free layer to an up direction +Z and the second magnetic field $H_2$ changes some magnetic domains to a down direction −Z, when the second current $J_1$ flows in a left direction −X, the magnetization direction of the first magnetic fixed unit 111 may be the down direction −Z and the magnetization direction of the second magnetic fixed unit 112 may be the up direction +Z. Also, in a second scenario, in a case which the first magnetic field $H_1$ changes all of the free layer to the up direction +Z and the second magnetic field $H_2$ changes some magnetic domains to the down direction −Z, when the second current $J_1$ flows in a right direction +X, the magnetization direction of the first magnetic fixed unit 111 may be the up direction +Z and the magnetization direction of the second magnetic fixed unit 112 may be the down direction −Z. And, in a third scenario, in a case which the first magnetic field $H_1$ changes all of the free layer to the down direction −Z and the second magnetic field $H_2$ changes some magnetic domains to the up direction +Z, when the second current $J_1$ flows in the left direction −X, the magnetization direction of the first magnetic fixed unit 111 may be the up direction +Z and the magnetization direction of the second magnetic fixed unit 112 may be the down direction −Z. Finally, in a fourth scenario, in a case which the first magnetic field $H_1$ changes all of the free layer to the down direction −Z and the second magnetic field $H_2$ changes some magnetic domains to the up direction +Z, when the second current $J_1$ flows in the right direction +X, the magnetization direction of the first magnetic fixed unit 111 may be the down direction −Z and the magnetization direction of the second magnetic fixed unit 112 may be the up direction +Z.

Referring to FIG. 6, magnetization directions of a first magnetic fixed unit 111 and a second magnetic fixed unit 112 are shown with respect to a direction of a first magnetic field $H_1$, a direction of a second magnetic field $H_2$, and a direction of a second current $J_1$. In a first scenario, in a case which the first magnetic field $H_1$ changes all of a free layer to a right direction +X and the second magnetic field $H_2$ changes some magnetic domains to a left direction −X, when the second current $J_1$ flows in the left direction −X, the magnetization direction of the first magnetic fixed unit 111 may be the left direction −X and the magnetization direction of the second magnetic fixed unit 112 may be the right direction +X. In a second scenario, in a case which the first magnetic field $H_1$ changes all of the free layer to the right direction +X and the second magnetic field $H_2$ changes some magnetic domains to the left direction −X, when the second current $J_1$ flows in the right direction +X, the magnetization direction of the first magnetic fixed unit 111 may be the right direction +X and the magnetization direction of the second magnetic fixed unit 112 may be the left direction −X. In a third scenario, in a case which the first magnetic field $H_1$ changes all of the free layer to the left direction −X and the second magnetic field $H_2$ changes some magnetic domains to the right direction +X, when the second current $J_1$ flows in the left direction −X, the magnetization direction of the first magnetic fixed unit 111 may be the right direction +X and the magnetization direction of the second magnetic fixed unit 112 may be the left direction −X. In a fourth scenario, in a case which the first magnetic field $H_1$ changes all of the free layer to the left direction −X and the second magnetic field $H_2$ changes some magnetic domains to the right direction +X, when the second current $J_1$ flows in the right direction +X, the magnetization direction of the first magnetic fixed unit 111 may be the left direction −X and the magnetization direction of the second magnetic fixed unit 112 may be the right direction +X.

Figure 7A:
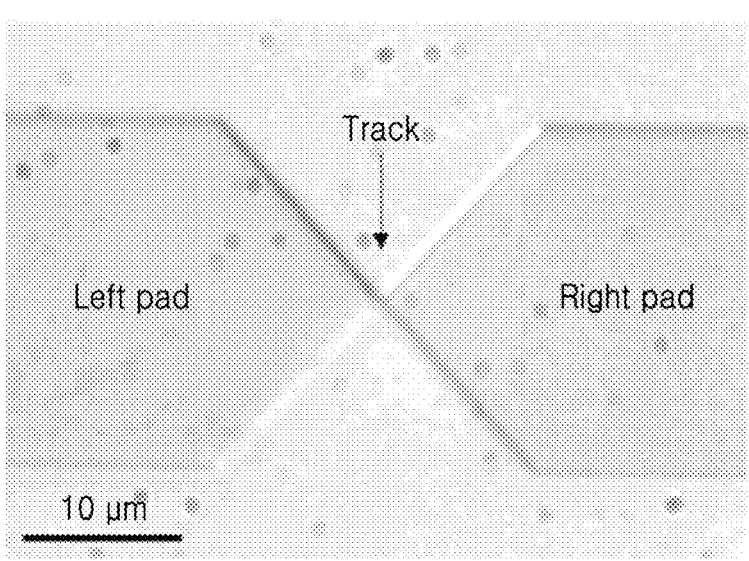
FIGS. 7A to 7C are electron microscope photographs showing initialization of a magnetic memory device, according to an embodiment.
Figure 7B:
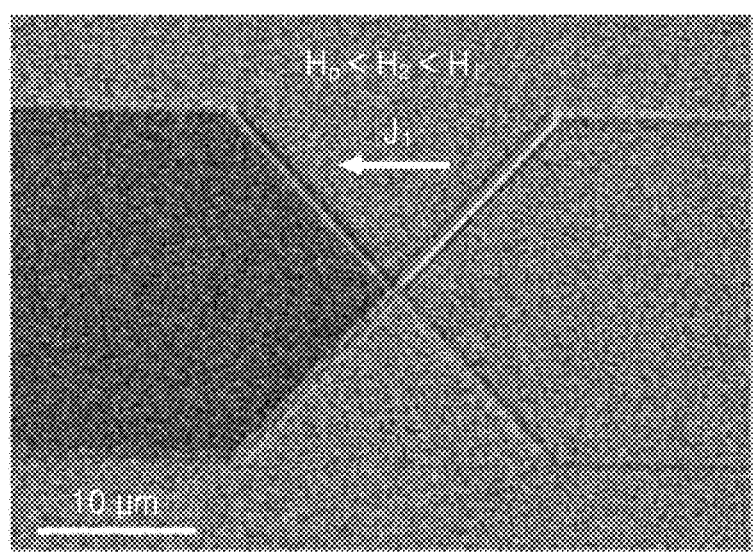
Figure 7C:
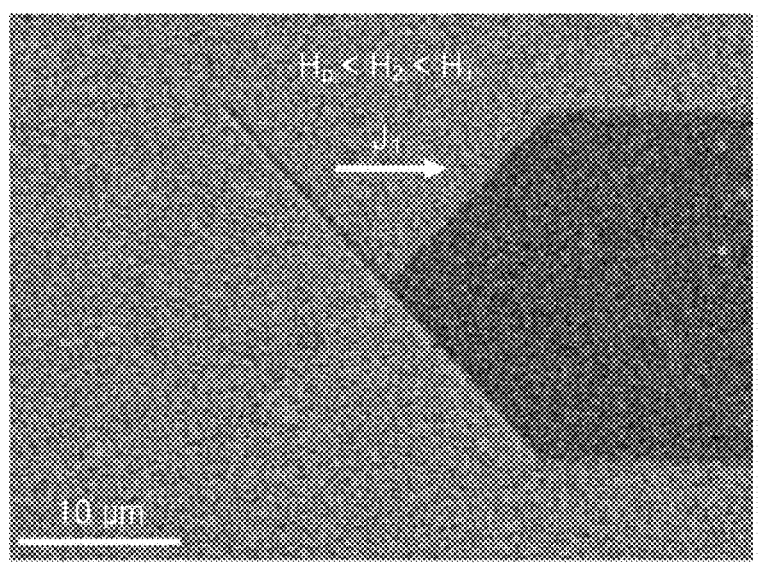

FIGS. 7A to 7C are electron microscope photographs showing the initialization of a magnetic memory device, according to an embodiment. Referring to FIGS. 7A to 7C, the inventors have manufactured a magnetic track layer which includes a first magnetic fixed unit (a left pad), a second magnetic fixed unit (a right pad), and a magnetic translation unit (a track) each having a fine size. Here, a contrast difference appearing in an electron microscope is shown with respect to a magnetization direction of a magnetic domain configuring a magnetic track layer, to confirm whether an operating method of a magnetic memory device according to an embodiment is accurately performed.

That is, when the second magnetic field described above is applied to the magnetic track layer within the same range, a shape where a magnetization direction of a first magnetic fixed unit (a left pad in the drawings) and a magnetization direction of a second magnetic fixed unit (a right pad in the drawings) are differently changed may be seen based on a direction (right or left) of the second current $J_1$ described above.

Figure 8:
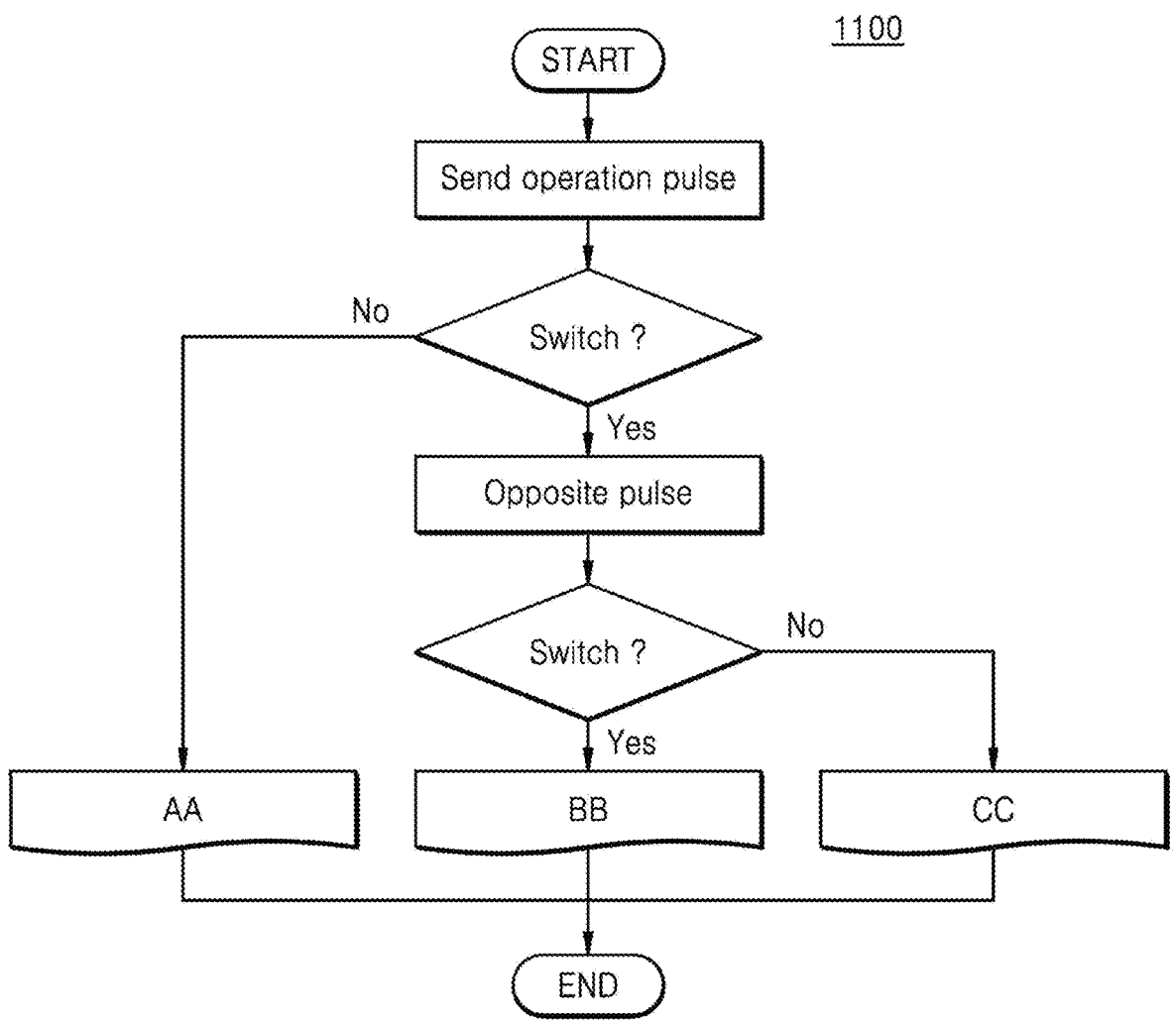
FIG. 8 is a flowchart illustrating an algorithm of a magnetic memory device according to an embodiment.

FIG. 8 is a flowchart illustrating an algorithm of a magnetic memory device according to an embodiment. Referring to FIG. 8, the stable initialization of the magnetic memory device may be performed by using an algorithm for an initialization process of the magnetic memory device.

First, it may be checked that a portion of a magnetization direction of a first magnetic fixed unit is changed after an operation of applying a current (an operation pulse). In this case, when a portion of the magnetization direction of the first magnetic fixed unit is changed, a next operation may be performed. On the other hand, when the magnetization direction of the first magnetic fixed unit is not changed, a failure AA may be determined.

Subsequently, after an operation of applying a magnetic field (an opposite pulse), whether a change occurs in all of the magnetization direction of the first magnetic fixed unit may be determined. In this case, when all of the magnetization direction of the first magnetic fixed unit is changed, a success BB may be determined. On the other hand, when all of the magnetization direction of the first magnetic fixed unit is not changed, a failure CC may be determined. A process of detecting an error of the operating method of the magnetic memory device according to an embodiment and correcting the error may be performed by using the algorithm for the initialization process.

Figure 9:
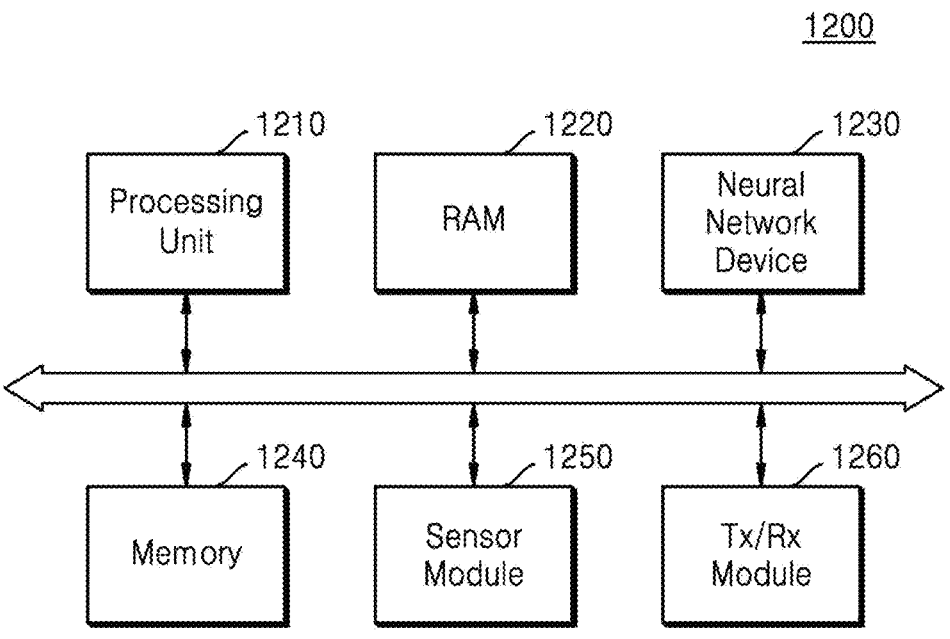
FIG. 9 is a block diagram illustrating an electronic system including a magnetic memory device, according to an embodiment.

FIG. 9 is a block diagram illustrating an electronic system 1200 including a magnetic memory device, according to an embodiment. Referring to FIG. 9, the electronic system 1200 may need a memory device in which a very number of data for a neural network device 1230 are to be stored, for a high-level operation such as artificial intelligence (AI).

The electronic system 1200 may analyze input data to extract valid information, based on the neural network device 1230 including a processing device, and may determine a situation or may control elements of an electronic device equipped with the electronic system 1200, based on the extracted information.

Human brain may transfer and process various signals through a neural network where a number of neurons are connected with one another, and thus, may learn and memorize massive information. Various attempts for developing a computing device or a processing device for copying a biological neural network to efficiently process massive information are being performed. Therefore, a non-volatile memory device which stores various information in the form of data may be needed, and particularly, as a memory device which may store and quickly read high-capacity data, a magnetic memory device may be needed.

The electronic system 1200 may be applied to robot devices such as drone and advanced drivers assistance system (ADAS), smart televisions (TVs), smartphones, medical devices, mobile devices, image display devices, measurement devices, and Internet of things (IoT) devices, and moreover, may be equipped in various kinds of electronic devices.

The electronic system 1200 may include a processing unit 1210, random access memory (RAM) 1220, a memory 1240, a sensor module 1250, and a communication module (Tx/Rx module) 1260, in addition to the neural network device 1230. Additionally, the electronic system 1200 may further include an input/output (I/O) module, a security module, and a power control device.

Some of hardware elements of the electronic system 1200 may be equipped as semiconductor chips. In the neural network device 1230, the magnetic memory device according to the embodiments described above may be implemented as an on-chip type, or the magnetic memory device according to the embodiments described above may be included as an element of the neural network device 1230.

The processing unit 1210 may control an overall operation of the electronic system 1200. The processing unit 1210 may be a central processing unit (CPU) and may include one processor core or may include a plurality of processor cores (multi-core). The processing unit 1210 may process or execute programs and/or data stored in the memory 1240 and may execute the programs stored in the memory 1240 to control a function of the neural network device 1230. The processing unit 1210 may be implemented as a graphics processing unit (GPU) or an application processor (AP), in addition to a CPU.

The RAM 1220 may temporarily store programs, data, or instructions. For example, the programs and/or the data each stored in the memory 1240 may be temporarily stored in the RAM 1220, based on a booting code or control by the processing unit 1210. The RAM 1220 may be implemented as a memory device such as dynamic RAM (DRAM) or static RAM (SRAM).

The neural network device 1230 may perform an arithmetic operation of a neural network, based on input data received thereby, and may generate an information signal, based on a performance result. The neural network device 1230 may include, as a memory device, the magnetic memory device according to the embodiments described above. The neural network may include convolution neural network (CNN), recurrent neural networks (RNN), deep belief networks, and restricted Boltzman machines, in addition to DNN, but is not limited thereto. The neural network device 1230 may correspond to a neural network dedicated hardware accelerator.

The information signal may include various kinds of recognition signals such as a sound recognition signal, a thing recognition signal, an image recognition signal, and a bio-information recognition signal. For example, the neural network device 1230 may receive frame data, included in a video stream, as input data and may generate a recognition signal corresponding to a thing included in an image represented by the frame data.

Based on the kind or function of an electronic device equipped with the electronic system 1200, the neural network device 1230 may receive various kinds of input data and may generate a recognition signal based on the input data.

The memory 1240 may be a storage for storing data and may store an operating system (OS), various kinds of programs, and various kinds of data. The memory 1240 may include a volatile memory or a non-volatile memory. The memory 1240 may include the magnetic memory device according to the embodiments described above.

The sensor module 1250 may collect peripheral information about an electronic device equipped with the electronic system 1200. The sensor module 1250 may include various kinds of sensing devices, and moreover, may sense or receive a signal (for example, an image signal, a sound signal, a magnetic signal, a bio signal, a touch signal, etc.) from the outside of the electronic device and may convert the sensed or received signal into data. Also, the sensor module 1250 may provide converted data as input data to the neural network device 1230.

The communication module 1260 may include various wired or wireless interfaces capable of communicating with an external device. The electronic system 1200 may further include a memory device storing and executing a processor and program data, a permanent storage such as a disk drive, a communication port communicating with an external device, and a user interface device such as a touch panel, a key, and a button.

Operating methods implemented as the algorithm described above or a software module may be computer-readable codes or program instructions executable in a processor and may be stored in a computer-readable recording medium.

Hereinabove, exemplary embodiments have been described in the drawings and the specification. Embodiments have been described by using the terms described herein, but this has been merely used for describing the inventive concept and has not been used for limiting a meaning or limiting the scope of the inventive concept defined in the following claims. Therefore, it may be understood by those of ordinary skill in the art that various modifications and other equivalent embodiments may be implemented from the inventive concept. Accordingly, the spirit and scope of the inventive concept may be defined based on the spirit and scope of the following claims.

While the inventive concept has been particularly shown and described with reference to embodiments thereof, it will be understood that various changes in form and details may be made therein without departing from the spirit and scope of the following claims.

What is claimed is:

1. A method of operating a magnetic memory device, the method comprising:
   applying a first magnetic field to a magnetic track layer (MTL), which includes a first magnetic fixed unit, a second magnetic fixed unit, and a magnetic translation unit (MTU) extending between the first magnetic fixed unit and the second magnetic fixed unit in a first direction, so that the first magnetic fixed unit, the second magnetic fixed unit, and the MTU have magnetization directions that are parallel to each other;
   applying a first current to the MTL so that a multi-domain is established within the MTU;
   applying a second magnetic field to the MTL so that the magnetization direction of the MTU switches to become anti-parallel to the magnetization directions of the first magnetic fixed unit and the second magnetic fixed unit;
   applying a second current to the MTL so that a portion of the multi-domain penetrates into the first magnetic fixed unit; and
   applying a third magnetic field to the MTL so that the magnetization direction of the first magnetic fixed unit switches to become anti-parallel to the magnetization direction of the second magnetic fixed unit.

2. The method of claim 1, wherein the MTU has a straight-line shape that extends lengthwise in the first direction, and wherein the first magnetic fixed unit and the second magnetic fixed unit contact first and second opposing ends, respectively, of the MTU.

3. The method of claim 2,
   wherein the first magnetic fixed unit and the second magnetic fixed unit have trapezoidal shapes and are configured as mirror images of each other relative to the MTU;
   wherein an angle between a virtual line extending along a sidewall of an end portion of the MTU and an oblique side of the second magnetic fixed unit is greater than 0 degrees and less than 90 degrees.

4. The method of claim 1, wherein a magnitude of the second magnetic field is greater than a magnetic field for enabling the multi-domain to move within the MTU, but less than a magnetic field for enabling the multi-domain to enter the first magnetic fixed unit and the second magnetic fixed unit.

5. The method of claim 4, wherein a magnitude of the third magnetic field is greater than a magnetic field for enabling the multi-domain to move within the first magnetic fixed unit, but less than a magnetic field for enabling the multi-domain to enter the second magnetic fixed unit.

6. The method of claim 5, wherein the first magnetic field is configured so that all of the first magnetic fixed unit, the second magnetic fixed unit, and the MTU have a second magnetization direction orthogonal to the first direction.

7. The method of claim 1, wherein a magnitude of the first current is greater than a threshold current for forming a multi-domain within the MTU.

8. The method of claim 7, wherein a magnitude of the second current is less than the threshold current, but greater than a current for enabling the multi-domain to move within the MTL.

9. The method of claim 1, further comprising placing a read unit on the MTU to thereby form a magnetic tunnel junction structure.

10. The method of claim 9, wherein the read unit is a pinned layer of the magnetic tunnel junction structure; wherein the MTL is a free layer of the magnetic tunnel junction structure; and wherein the read unit is configured to read a magnetization direction of the MTU.

11. An operating method of a magnetic memory device for fixing a magnetization direction of a first magnetic pad and a magnetization direction of a second magnetic pad to an anti-parallel state with respect to each other, the operating method comprising:

preparing a magnetic tunnel junction structure including a free layer where a magnetic translation unit is disposed between the first magnetic pad and the second magnetic pad in a horizontal direction and a tunnel barrier layer and a pinned layer each disposed on the magnetic translation unit in a vertical direction;

applying a first magnetic field to the free layer so that the first magnetic pad, the second magnetic pad, and the magnetic translation unit have magnetization directions parallel to one another;

applying a first current to the free layer so that a multi-domain is formed in the magnetic translation unit;

applying a second magnetic field to the free layer so that a magnetization direction of the magnetic translation unit is anti-parallel to magnetization directions of the first magnetic pad and the second magnetic pad;

applying a second current to the free layer so that a portion of the multi-domain penetrates into the first magnetic pad; and applying a third magnetic field to the free layer so that the magnetization direction of the first magnetic pad is anti-parallel to the magnetization direction of the second magnetic pad.

12. The method of claim 11, wherein the free layer is a magnetic track layer where the first magnetic pad, the magnetic translation unit, and the second magnetic pad have a bow tie shape.

13. The method of claim 11, further comprising fixing a magnetization direction of the first magnetic pad and a magnetization direction of the second magnetic pad to an anti-parallel state with respect to each other and reading a magnetization direction of the magnetic translation unit by using the magnetic tunnel junction structure.

14. The method of claim 13, wherein each of the first magnetic pad and the second magnetic pad is electrically connected to a conductive layer.

15. The method of claim 11, wherein the first magnetic field is a magnetic field which is programmed so that all of the free layer have the same magnetization direction;

wherein the second magnetic field is greater than a magnetic field for enabling the multi-domain to move in the magnetic translation unit and is less than a magnetic field for enabling the multi-domain to enter the first magnetic pad and the second magnetic pad; and wherein the third magnetic field is greater than a magnetic field for enabling the multi-domain to move in the first magnetic pad and is less than a magnetic field for enabling the multi-domain to enter the second magnetic pad.

16. A method of operating a magnetic memory device, the method comprising:

in a magnetic tunnel junction structure including a stack structure of a free layer, a tunnel barrier layer, and a pinned layer, the free layer comprising a first magnetic pad, a second magnetic pad, and a magnetic translation unit disposed between the first magnetic pad and the second magnetic pad in a horizontal direction, applying a magnetic field pulse to the free layer three times and applying a current pulse to the free layer twice for fixing a magnetization direction of the first magnetic pad and a magnetization direction of the second magnetic pad to be in an anti-parallel state with respect to each other.

17. The method of claim 16, wherein the free layer is a magnetic track layer where the first magnetic pad, the magnetic translation unit, and the second magnetic pad have a bow tie shape.

18. The method of claim 16, wherein the current pulse applied twice comprises a first current pulse and a second current pulse;

wherein the first current pulse is greater than a threshold current for forming a multi-domain in the magnetic translation unit; and wherein the second current pulse is less than the threshold current and is greater than a current pulse for enabling the multi-domain to move in the free layer.

19. The method of claim 18, wherein the magnetic field pulse applied three times comprises a first magnetic field pulse, a second magnetic field pulse, and a third magnetic field pulse;

wherein the first magnetic field pulse is programmed so that all of the first magnetic pad, the second magnetic pad, and the magnetic translation unit have same magnetization direction;

wherein the second magnetic field pulse is greater than a magnetic field for enabling the multi-domain to move in the magnetic translation unit and is less than a magnetic field for enabling the multi-domain to enter the first magnetic pad and the second magnetic pad; and wherein the third magnetic field pulse is substantially the same as the second magnetic field pulse.

20. The method of claim 19, wherein the first magnetic field pulse, the first current pulse, the second magnetic field pulse, the second current pulse, and the third magnetic field pulse are applied to the free layer in an order.

* * * * *